US010923658B2

(12) United States Patent
Yasuda et al.

(10) Patent No.: US 10,923,658 B2
(45) Date of Patent: Feb. 16, 2021

(54) MEMORY CELLS AND METHODS OF FORMING MEMORY CELLS

(71) Applicant: Micron Technology, Inc., Boise, ID (US)

(72) Inventors: Shuichiro Yasuda, Boise, ID (US); Noel Rocklein, Boise, ID (US); Scott E. Sills, Boise, ID (US); Durai Vishak Nirmal Ramaswamy, Boise, ID (US); Qian Tao, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/440,718

(22) Filed: Jun. 13, 2019

(65) Prior Publication Data

US 2019/0296235 A1 Sep. 26, 2019

Related U.S. Application Data

(60) Continuation of application No. 15/334,186, filed on Oct. 25, 2016, now Pat. No. 10,388,871, which is a
(Continued)

(51) Int. Cl.
*H01L 45/00* (2006.01)

(52) U.S. Cl.
CPC .......... *H01L 45/1616* (2013.01); *H01L 45/04* (2013.01); *H01L 45/085* (2013.01);
(Continued)

(58) Field of Classification Search
CPC .................................................. H01L 45/1616
See application file for complete search history.

(56) References Cited

U.S. PATENT DOCUMENTS

| 8,369,128 B2 | 2/2013 | Shiimoto et al. |
| 8,420,478 B2 | 4/2013 | Chiang et al. |

(Continued)

FOREIGN PATENT DOCUMENTS

| CN | 102683376 | 9/2012 |
| CN | 102855929 | 2/2013 |

(Continued)

OTHER PUBLICATIONS

WO PCT/US2013/074411 Search Rept., dated Apr. 25, 2014, Micron Technology, Inc.
(Continued)

*Primary Examiner* — Moazzam Hossain
(74) *Attorney, Agent, or Firm* — Wells St. John P.S.

(57) ABSTRACT

Some embodiments include a method of forming a memory cell. A first portion of a switching region is formed over a first electrode. A second portion of the switching region is formed over the first portion using atomic layer deposition. The second portion is a different composition than the first portion. An ion source region is formed over the switching region. A second electrode is formed over the ion source region. Some embodiments include a memory cell having a switching region between a pair of electrodes. The switching region is configured to be reversibly transitioned between a low resistive state and a high resistive state. The switching region includes two or more discrete portions, with one of the portions not having a non-oxygen component in common with any composition directly against it in the high resistive state.

12 Claims, 3 Drawing Sheets

Related U.S. Application Data division of application No. 14/584,504, filed on Dec. 29, 2014, now Pat. No. 9,508,931, which is a division of application No. 13/738,201, filed on Jan. 10, 2013, now Pat. No. 8,921,821.

(52) U.S. Cl.
CPC ...... *H01L 45/1233* (2013.01); *H01L 45/1253* (2013.01); *H01L 45/1266* (2013.01); *H01L 45/145* (2013.01); *H01L 45/146* (2013.01); *H01L 45/147* (2013.01)

(56) References Cited

U.S. PATENT DOCUMENTS

| | | | |
|---|---|---|---|
| 8,427,860 B2 | 4/2013 | Ohba et al. | |
| 8,547,735 B2 | 10/2013 | Mizuguchi et al. | |
| 8,618,527 B2 | 12/2013 | Hattori et al. | |
| 8,698,119 B2 | 4/2014 | Tendulkar et al. | |
| 8,730,709 B2 | 5/2014 | Ohba et al. | |
| 8,796,656 B2 | 8/2014 | Ramaswamy et al. | |
| 9,058,873 B2 | 6/2015 | Shimuta et al. | |
| 9,240,549 B2 | 1/2016 | Ohba et al. | |
| 9,466,791 B2 | 10/2016 | Hiroaki et al. | |
| 9,543,514 B2 | 1/2017 | Ohba et al. | |
| 2002/0175273 A1* | 11/2002 | Moddel | H01L 29/7606 250/214 R |
| 2006/0255329 A1* | 11/2006 | Ufert | H01L 45/085 257/5 |
| 2007/0117256 A1 | 5/2007 | Stewart | |
| 2008/0011996 A1 | 1/2008 | Bednorz et al. | |
| 2008/0054244 A1 | 3/2008 | Lee et al. | |
| 2008/0299765 A1 | 12/2008 | Besling | |
| 2009/0014707 A1 | 1/2009 | Lu | |
| 2009/0290407 A1* | 11/2009 | Mouli | H01L 27/101 365/158 |
| 2010/0140578 A1 | 6/2010 | Tian et al. | |
| 2010/0243983 A1 | 9/2010 | Chiang et al. | |
| 2010/0264394 A1 | 10/2010 | Aozasa | |
| 2011/0133152 A1 | 6/2011 | Choi | |
| 2011/0149635 A1 | 6/2011 | Shiimoto et al. | |
| 2011/0180775 A1* | 7/2011 | Lin | H01L 45/1233 257/4 |
| 2011/0194329 A1 | 8/2011 | Ohba et al. | |
| 2011/0291066 A1* | 12/2011 | Baek | H01L 45/146 257/4 |
| 2011/0297927 A1* | 12/2011 | Ramaswamy | H01L 45/1233 257/43 |
| 2011/0303887 A1 | 12/2011 | Otsuka | |
| 2011/0309321 A1* | 12/2011 | Yang | H01L 45/146 257/5 |
| 2011/0310656 A1* | 12/2011 | Kreupl | H01L 45/145 365/148 |
| 2012/0025163 A1 | 2/2012 | Onishi | |
| 2012/0068146 A1* | 3/2012 | Hattori | H01L 27/2472 257/4 |
| 2012/0085985 A1* | 4/2012 | Yang | B82Y 10/00 257/9 |
| 2012/0112153 A1 | 5/2012 | Ninomiya | |
| 2012/0153249 A1 | 6/2012 | Zhang et al. | |
| 2012/0176831 A1* | 7/2012 | Xiao | G11C 8/10 365/148 |
| 2012/0225532 A1 | 9/2012 | Hautala | |
| 2012/0236625 A1 | 9/2012 | Ohba | |
| 2012/0248396 A1 | 10/2012 | Ramaswamy et al. | |
| 2012/0292587 A1 | 11/2012 | Matsuo et al. | |
| 2013/0001496 A1 | 1/2013 | Shimuta | |
| 2013/0026440 A1 | 1/2013 | Yang | |
| 2013/0037772 A1 | 2/2013 | Sills | |
| 2013/0134376 A1* | 5/2013 | Tong | H01L 45/146 257/4 |
| 2013/0182487 A1* | 7/2013 | Lee | H01L 45/085 365/148 |
| 2013/0187110 A1 | 7/2013 | Tendulkar et al. | |
| 2013/0214231 A1* | 8/2013 | Lee | H01L 45/1253 257/2 |
| 2013/0240818 A1 | 9/2013 | Ohba et al. | |
| 2013/0248795 A1 | 9/2013 | Takahashi | |
| 2013/0248797 A1 | 9/2013 | Sandhu | |
| 2013/0256622 A1 | 10/2013 | Hiroaki et al. | |
| 2013/0256624 A1* | 10/2013 | Kau | H01L 45/1253 257/4 |
| 2013/0320289 A1 | 12/2013 | Chen | |
| 2013/0341584 A1 | 12/2013 | Kuse et al. | |
| 2014/0175354 A1 | 6/2014 | Wang | |
| 2014/0175361 A1* | 6/2014 | Hsueh | H01L 45/1233 257/4 |
| 2014/0175603 A1* | 6/2014 | Ananthan | H01L 45/1633 257/532 |
| 2014/0183438 A1 | 7/2014 | Ohba et al. | |
| 2014/0192586 A1* | 7/2014 | Nardi | H01L 45/146 365/148 |
| 2014/0362634 A1 | 12/2014 | Ramaswamy et al. | |
| 2015/0041746 A1* | 2/2015 | Yasuda | H01L 45/1266 257/2 |
| 2015/0333256 A1* | 11/2015 | Maesaka | H01L 45/1608 257/4 |
| 2016/0079528 A1 | 3/2016 | Ohba et al. | |

FOREIGN PATENT DOCUMENTS

| | | |
|---|---|---|
| CN | 201380070048.3 | 12/2016 |
| EP | 2495729 | 9/2012 |
| EP | 2541555 | 1/2013 |
| EP | 13870616 | 7/2016 |
| JP | 2003-347297 | 12/2003 |
| JP | 2009-146478 | 7/2009 |
| JP | 2010-062247 | 3/2010 |
| JP | 2011-134909 | 7/2011 |
| JP | 2011-187925 | 9/2011 |
| JP | 2012-064808 | 3/2012 |
| JP | 2012-523119 | 9/2012 |
| JP | 2013-016529 | 1/2013 |
| JP | 2013211411 | 10/2013 |
| KR | 10-2011-0093620 | 8/2011 |
| TW | 201143082 | 12/2011 |
| TW | 201218473 | 5/2012 |
| WO | WO PCT/US2013/074411 | 7/2015 |

OTHER PUBLICATIONS

WO PCT/US2013/074411 Writ. Opin., dated Apr. 25, 2014, Micron Technology, Inc.

TW TW 102148507 Search Rept Trans, dated May 27, 2015, Micron Technology.

* cited by examiner

US 10,923,658 B2

MEMORY CELLS AND METHODS OF FORMING MEMORY CELLS

RELATED PATENT DATA

This patent resulted from a continuation of U.S. patent application Ser. No. 15/334,186 which was filed Oct. 25, 2016, which is a divisional of U.S. patent application Ser. No. 14/584,504 which was filed Dec. 29, 2014, which resulted from a divisional of U.S. patent application Ser. No. 13/738,201 which was filed on Jan. 10, 2013, now U.S. Pat. No. 8,921,821; each of which is hereby incorporated by reference.

TECHNICAL FIELD

Memory cells and methods of forming memory cells.

BACKGROUND

Integrated memory may be used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

An example memory cell is a programmable metallization cell (PMC). Such may be alternatively referred to as conductive bridging random access memory (CBRAM), nanobridge memory, or electrolyte memory. A PMC may use ion conductive switching material (for instance, a suitable chalcogenide or any of various suitable oxides) and an ion source material adjacent the switching material. The ion source material and switching material may be provided between a pair of electrodes. A suitable voltage applied across the electrodes can cause ions to migrate from the ion source material into the switching material to thereby create one or more current-conductive paths through the switching material. An opposite voltage applied across the electrodes essentially reverses the process and thus removes the current-conductive paths. A PMC thus comprises a high resistance state (corresponding to the state lacking a conductive bridge extending through a switching material) and a low resistance state (corresponding to the state having a conductive bridge extending through a switching material), with such states being reversibly interchangeable with one another.

Although there has been effort toward development of PMCs and other memory cells, there remains a need for improved memory cells.

DETAILED DESCRIPTION OF THE ILLUSTRATED EMBODIMENTS

Two performance aspects of PMCs are switching and retention. It is desired that switching be relatively easy so that a PMC may be rapidly switched from one memory state to another with relatively low voltage. It is also desired that a PMC have good retention characteristics, so that the PMC does not inadvertently switch between memory states without the appropriate voltage input. Characteristics which lead to easy switching are often opposite to those which lead to good retention. A difficulty encountered in fabrication of PMCs is that it can be difficult to balance the competing goals of easy switching and good retention. Some embodiments provided herein utilize two or more different compositions within a switching region to enable characteristics of the switching region to be tailored to achieve a desired balance between switchability and retention. Example embodiments are described with reference to FIGS. 1-11.

Figure 1:
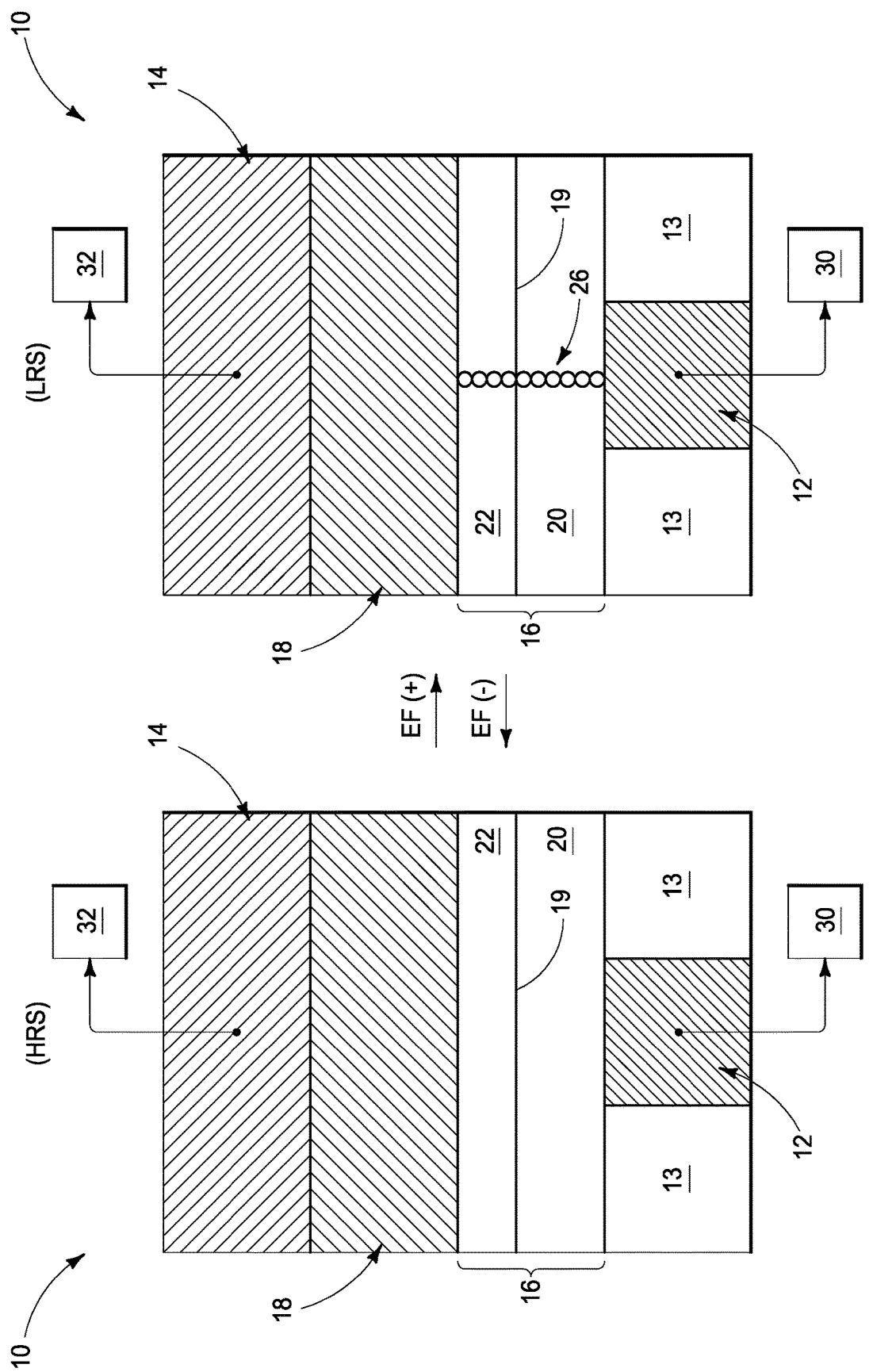
FIG. 1 diagrammatically illustrates an example embodiment PMC reversibly transitioning between a low resistance state and a high resistance state.

Referring to FIG. 1, a PMC 10 is illustrated in two modes corresponding to a high resistance state (HRS) and a low resistance state (LRS). The two modes are reversibly interchanged with one another through application of electric fields $EF^+$ and $EF^-$, with $EF^+$ being of opposite polarity relative to $EF^-$.

The PMC device comprises a pair of electrodes 12 and 14; and comprises a switching region 16 and an ion source region 18 between the electrodes.

Electrodes 12 and 14 may comprise any suitable electrically conductive composition or combination of compositions; and may be the same composition as one another or may be different compositions relative to one another. In some embodiments, the electrodes may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). For instance, in some embodiments the electrode 12 may comprise, consist essentially of, or consist of titanium nitride; and the electrode 14 may comprise, consist essentially of, or consist of tungsten.

In the shown embodiment, the electrode 12 extends through a dielectric material 13. In some embodiments, such dielectric material may comprise, consist essentially of, or consist of silicon nitride.

The memory cell 10 is shown to have the bottom electrode 12 connected to external circuitry 30, and to have the top electrode 14 connected to external circuitry 32. Circuitries 30 and 32 may include sense and/or access lines coupled to the electrodes, and configured for providing appropriate electric fields across the memory cell during read/write operations. In some embodiments, the illustrated memory cell may be one of a plurality of memory cells of a memory array, and the circuitries 30 and 32 may be part of a circuit configuration utilized to uniquely address each of the memory cells of the array. In some embodiments, a "select device" (not shown) may be provided adjacent the memory cell 10 to reduce undesired current leakage to and/or from the memory cell during utilization of the memory cell in a memory array. Example select devices include diodes, transistors, ovonic threshold switches, etc.

The ion source region 18 contributes ions which ultimately form one or more conductive bridges across the switching region 16. The ion source region may comprise any suitable composition or combination of compositions. In some embodiments, the ion source region may comprise one or more of aluminum, copper, silver and tellurium; and may be configured for contributing aluminum cations, copper cations and/or silver cations for formation of one or more conductive bridges.

Although the ion source region is shown comprising a single composition, in other embodiments the ion source region may comprise two or more different compositions. For instance, in some embodiments the ion source region may have a first portion comprising AlTeN, where the listed composition is described in terms of elemental constituents rather than in terms of a specific stoichiometry; and may have a second portion comprising CuZrAlTeO, where the listed composition is described in terms of elemental constituents rather than in terms of a specific stoichiometry. The first portion may be directly against the switching region 16, and the second portion may be between the first portion and the top electrode 14. An ion source region comprising two portions is described below with reference to FIG. 4.

At least a portion of the switching region 16 may be formed by atomic layer deposition (ALD) to enable such portion to be tailored relative to composition and thickness. For instance, the illustrated switching region 16 of FIG. 1 is shown to comprise two portions 20 and 22 of different compositions relative to one another, with an interface between such two portions being diagrammatically illustrated with the line 19; and in some embodiments at least one of such portions may be formed with ALD.

In some embodiments, a switching region portion formed by ALD may have a thickness within a range of from greater than 0 angstroms (Å) to less than or equal to about 20 Å; and in some embodiments may have a thickness of less than or equal to about 12 Å. In the shown application of FIG. 1 in which the switching region comprises two portions 20 and 22, both of such portions may be formed by ALD in some embodiments; and in other embodiments one of the portions may be formed by ALD, and the other portion may be formed by any other suitable method, including, for example, physical vapor deposition (PVD), chemical vapor deposition (CVD), and/or oxidation of a surface underlying such portion. For instance, in some embodiments the portion 20 may be formed by oxidation of a surface of electrode 12, and thus may comprise titanium oxide or $TiO_xN_y$ in embodiments in which electrode 12 comprises titanium nitride. If the portion 20 is formed by oxidation of a surface of electrode 12, the portion 20 may extend only across the upper surface of electrode 12, rather than having the shown configuration in which the portion 20 also extends across surfaces of dielectric material 13.

The various portions of the switching region may comprise any suitable composition or combination of compositions; and in some embodiments may comprise, consist essentially of, or consist of one or more of GeS, GeSe, SiO, ZrO, TiO, TaO, HfO, AlO, WO, SnO, NbO, HfSiO, ZrTiO, ZrWO, AlTiO, VO, MoO, NiO, YO, ReO, MnO, FeO, SiAlO, SiTiO, etc.; where the listed compositions are described in terms of elemental constituents, rather than in terms of specific stoichiometries (for instance, AlO may correspond to $Al_2O_3$). In some embodiments, an ALD-formed portion may comprise HfSiO formed to a thickness within a range of from greater than 0 angstroms to less than or equal to about 16 angstroms; and in some embodiments a total thickness of a two-portion switching region may be about 20 angstroms, with one of the portions being ALD-formed HfSiO having a thickness of about 16 angstroms.

In some embodiments, one of the portions 20 and 22 may consist of oxygen in combination with one or more transition metals (specifically, metals within groups 3-12 of the periodic table); and the other of the portions 20 and 22 may consist of oxygen in combination with one or more non-transition elements (i.e., elements not within groups 3-12 of the periodic table); where the non-transition elements may be selected from the group consisting of metals, semimetals, alkaline earth elements, and mixtures thereof in some embodiments. For instance, in some embodiments one of the portions may comprise one or more of hafnium oxide, zirconium oxide and titanium oxide; and the other of the portions may comprise one or both of silicon dioxide and aluminum oxide. In an example embodiment utilizing an alkaline earth element, one of the portions may comprise magnesium oxide. Either or both of the portions may be formed by ALD, and either or both of the portions may have a thickness within a range of from greater than 0 Å to less than or equal to about 20 Å, and in some embodiments less than or equal to about 12 Å.

The utilization of two portions of different compositions relative to one another in the switching region 16 can enable characteristics of the switching region to be tailored to achieve a desired balance between switchability and retention. In some embodiments it is found that the utilization of an ALD-formed portion of the switching region can enable the switching region to be formed with characteristics better than those achieved in the absence of such ALD-formed portion. For instance, in some embodiments one of the first and second portions of the switching region comprises hafnium oxide and the other comprises aluminum oxide; with at least one of the portions being formed by ALD. The switching region is found to have better switchability and retention characteristics relative to a switching region comprising only hafnium oxide, or only aluminum oxide. Further, the balance between switchability and retention may be correlated to the relative thicknesses of the hafnium oxide and the aluminum oxide, and thus such balance may be tuned utilizing adjustments of the relative thicknesses.

Although the switching region of FIG. 1 comprises two portions, in other embodiments switching regions may be formed to comprise more than two regions. An example of a switching region comprising more than two regions is described below with reference to FIG. 10. Also, in some embodiments a switching region may be formed to comprise a single homogeneous ALD-formed material, rather than multiple portions. An example of a switching region comprising only a single homogeneous ALD-formed material is described below with reference to FIG. 11.

In some embodiments, an ALD-formed portion of a switching region may have a thickness less than a single monolayer; or in other words may be formed with too few cycles to complete a full monolayer. For instance, in some embodiments an ALD-formed portion may be formed utilizing from one to five ALD cycles under conditions which fail to complete a full monolayer, and thus may comprise modified regions scattered across a surface. An example embodiment in which a portion of a switching region is formed to comprise scattered modified regions, rather than a full monolayer, is described below with reference to FIGS. 8 and 9.

The switching region 16 of FIG. 1 is shown to comprise a conductive bridge 26 in the LRS mode, and to not comprise such conductive bridge in the HRS mode. Although only one conductive bridge is shown, in some embodiments there may be multiple conductive bridges present in the LRS mode. Also, although the conductive bridge 26 is shown to span an entire distance from a top surface of electrode 12 to a bottom surface of ion source 18, in other embodiments the conductive bridge may only extend partially across such distance. For instance, in some embodiments a conductive bridge may be discontinuous, and may be broken by one or more small gaps. In operation, charge carriers may "jump" such gaps to complete a circuit across the switching region. Although the conductive bridge 26 is shown to be entirely absent in the HRS mode of the cell, in other embodiments a portion of the conductive bridge may be present in the HRS mode.

Figure 2:
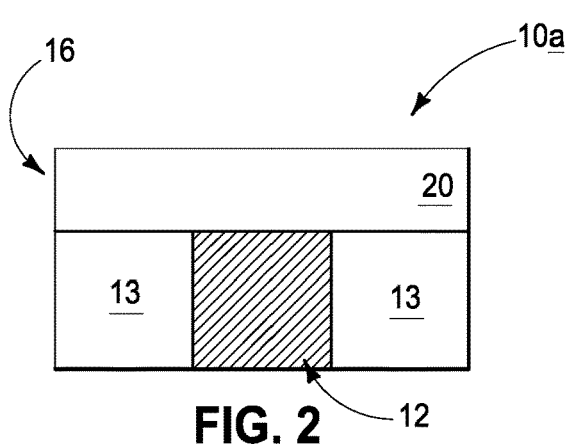
FIGS. 2-4 show a semiconductor construction in cross-sectional view, and diagrammatically illustrate process stages of an example embodiment process for forming an example embodiment memory cell.
Figure 3:
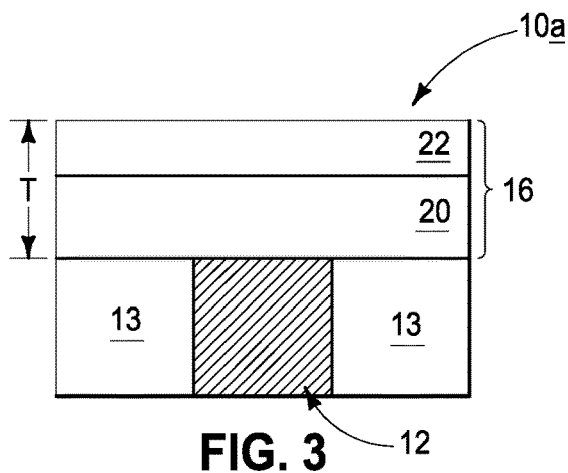
Figure 4:
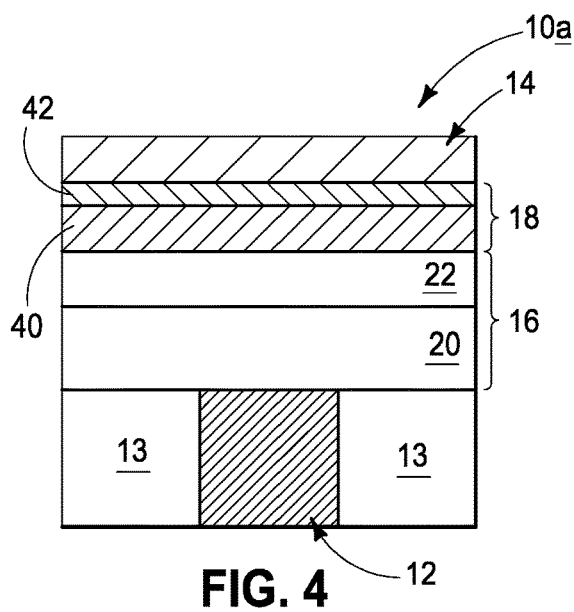
Figure 5:
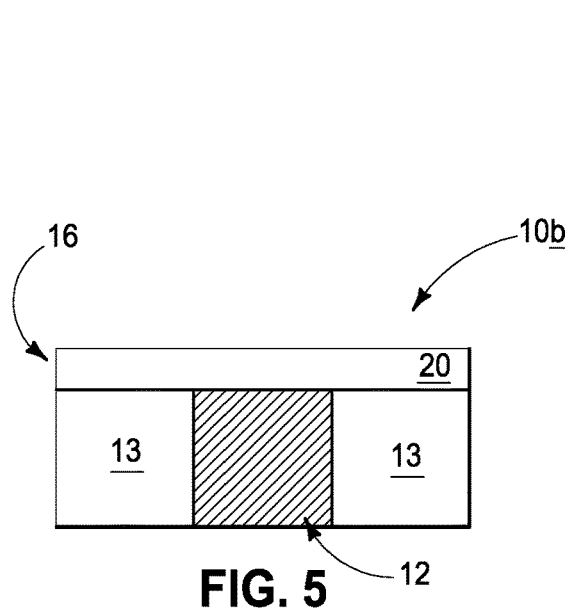
FIGS. 5-7 show a semiconductor construction in cross-sectional view, and diagrammatically illustrate process stages of another example embodiment process for forming another example embodiment memory cell.
Figure 6:
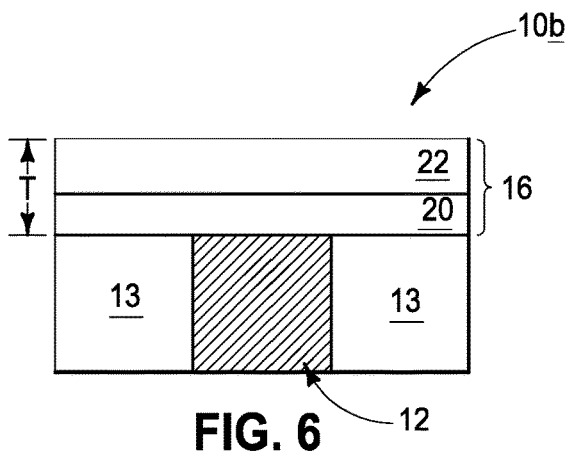
Figure 7:
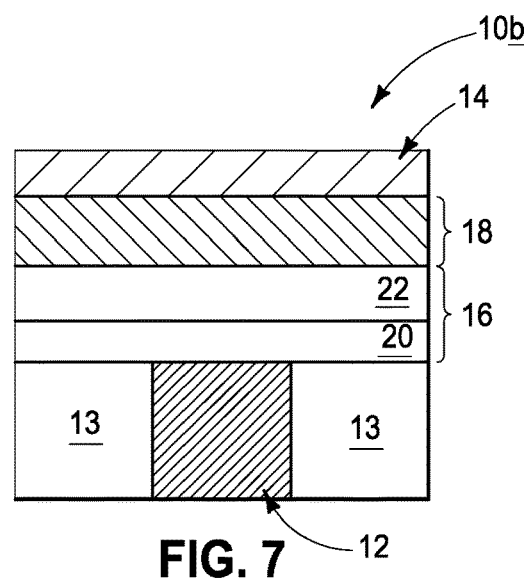
Figure 8:
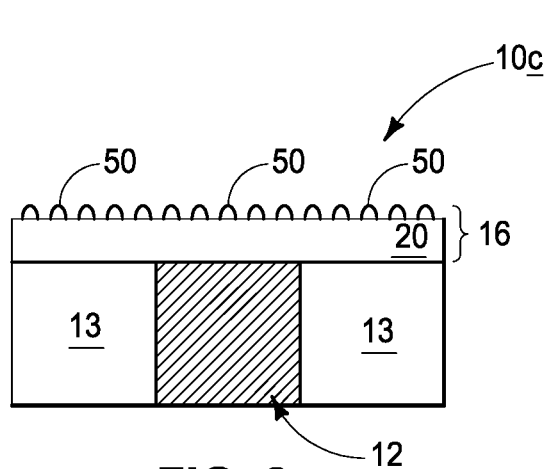
FIGS. 8 and 9 show a semiconductor construction in cross-sectional view, and diagrammatically illustrate process stages of another example embodiment process for forming another example embodiment memory cell.
Figure 9:
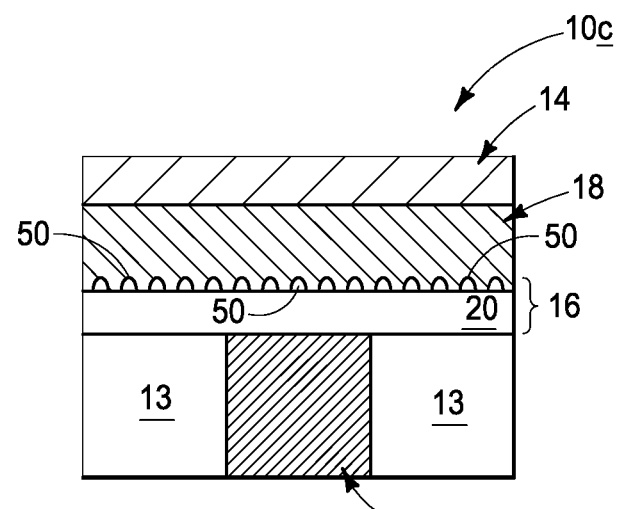

Some example methods for forming example embodiment memory cells are described with reference to FIGS. 2-9; with FIGS. 2-4 illustrating one example method, FIGS. 5-7 illustrating another example method, and FIGS. 8 and 9 illustrating yet another example method.

Referring to FIG. 2, a construction 10a comprises the electrode 12 and the dielectric material 13 discussed above with reference to FIG. 1. The first portion 20 of switching region 16 is formed over electrode 12, and in the shown embodiment is directly against an upper surface of the electrode. The first portion 20 may be formed with any suitable processing, and in some example embodiments may be formed with one or more of ALD, CVD, PVD and oxidation of an upper surface of electrode 12.

Referring to FIG. 3, the second portion 22 of the switching region is formed over the first portion 20 utilizing ALD. The switching region 16 has a total thickness "T", and in some embodiments such thickness may be within a range of from about 6 Å to about 20 Å. In some embodiments, the ALD-formed portion 22 may have a thickness of from greater than 0 Å to less than or equal to about 12 Å. Thus, the ALD-formed portion 22 may comprise at least about 50% of the total thickness of the switching region 16, by volume, in some embodiments; and may comprise less than about 50% of the total thickness, by volume, in other embodiments.

The first and second portions 20 and 22 are separate discrete portions of the switching region 16, and thus comprise different compositions relative to one another. In some embodiments, one of the portions 20 and 22 comprises a transition metal oxide, and the other does not. For instance, in some embodiments the portion 20 may comprise, consist essentially of, or consist of one or more transition metals in combination with oxygen; and the ALD-formed portion 22 may comprise, consist essentially of, or consist of one or more non-transition elements in combination with oxygen; where at least one of the non-transition elements may be selected from the group consisting of metals, semi-metals, alkaline earth elements, and mixtures thereof. In other embodiments, the first portion 20 may comprise, consist essentially of, or consist of the one or more non-transition elements in combination with oxygen; and the second portion 22 may comprise, consist essentially of, or consist of the one or more transition metals in combination with oxygen. In some embodiments, the non-transition elements may include one or both of silicon and aluminum, and the transition metals may include one or more of hafnium, titanium and zirconium. Accordingly, in some embodiments the ALD-formed portion 22 and the portion 20 may comprise different compositions from one another, with such composition comprising oxygen in combination with one or more of aluminum, hafnium, silicon, titanium and zirconium.

In embodiments in which the ALD-formed portion 22 comprises transition metal oxide, the ALD formation of portion 22 may be considered to comprise deposition of one or more transition metals over the surface of portion 20; and in embodiments in which the ALD-formed portion 22 comprises a non-transition element oxide, the ALD formation of portion 22 may be considered to comprise deposition of one or more non-transition elements over the surface of portion 20 (with such non-transition elements being selected from the group consisting of metals, semimetals, alkaline earth elements, and mixtures thereof, in some embodiments).

Referring to FIG. 4, an ion source region 18 is formed over switching region 16, and the top electrode 14 is formed over the ion source region. In the shown embodiment, the ion source region 18 comprises two discrete portions 40 and 42, which may be referred to as a first portion and a second portion, respectively. In some embodiments, each of the portions 40 and 42 comprises at least one of copper, silver and aluminum. For instance, in some embodiments the first portion 40 comprises AlTeN, where the listed composition is described in terms of elemental constituents rather than in terms of a specific stoichiometry; and the second portion 42 comprises CuZrAlTeO, where the listed composition is described in terms of elemental constituents rather than in terms of a specific stoichiometry. The first portion is directly against the switching region 16 in the shown embodiment, and the second portion is between the first portion and the top electrode 14.

The construction of FIG. 4 comprises a multi-portion switching region 16. Such switching region may be tailored for particular applications by adjusting the thicknesses and compositions of the portions 20 and 22, which can provided advantages relative to prior art constructions utilizing only a single material throughout a switching region. A construction having a multi-portion switching region has been described in the prior art, and specifically is described in U.S. Patent Publication 2011/0194329. Such construction forms one portion of a multi-portion switching region by oxidizing a surface, and thus a composition of such portion of the multi-portion switching region is dictated by the surface underlying the switching region. In contrast, each portion of the multi-portion switching region 16 of FIG. 4 may be formed by a deposition process. Accordingly, whereas at least one of the portions of the switching regions of the constructions described in U.S. Patent Publication 2011/0194329 will have a non-oxygen component in common with a composition directly against such portion, the compositions of both portions of the switching region 16 of FIG. 4 may have compositions which do not have any non-oxygen component in common with compositions directly against such portions. In some embodiments, the relationship that both portions of the switching region 16 may have compositions which do not have any non-oxygen component in common with compositions directly against such portions holds true in the HRS mode of the memory cell (i.e., the mode in which a conductive filament does not extend through the switching material), but may not hold true in the LRS mode of the memory cell since the conductive filament may be formed of ions which migrate from a composition directly against the switching material. However, in some embodiments each portion of the switching region 16 may be considered to comprise a primary matrix within which ions migrate during assembly and disassembly of a conductive filament; and in such embodiments the primary matrix of each portion may be formed to not have any non-oxygen component in common with any composition directly against such primary matrix regardless of whether the memory cell is in the HRS mode or the LRS mode.

The ability to utilize compositions of the switching material which do not have any non-oxygen components in common with compositions directly against the switching material may enable the construction of FIG. 4 to be formed with additional degrees of freedom relative to embodiments described in U.S. Patent Publication 2011/0194329, which may enable the construction of FIG. 4 to be better tailored for some applications.

Although it may be advantageous to form a switching material of a composition which does not have any non-oxygen components in common with structures directly against the switching material in some embodiments, in other embodiments it may be desired to form the switching material of a composition having one or more non-oxygen components in common with the structures directly against the switching material. Accordingly, some embodiments include formation of switching material having a portion containing one or more non-oxygen components in common with structures directly against such portion of the switching material. In such embodiments, the portion of the switching material may be formed by, for example, ALD, CVD, PVD, and/or oxidation of a structure directly against such portion of the switching material.

Although the embodiment of FIGS. 2-4 is described as having a first portion 20 which may or may not be formed by ALD, and a second portion 22 which is an ALD-formed portion; in other embodiments the processing may be reversed so that the first portion 20 is an ALD-formed portion, and the second portion 22 may or may not be formed by ALD. FIGS. 5-7 illustrate an example embodiment in which the first portion 20 is an ALD-formed portion.

Referring to FIG. 5, a construction 10*b* comprises the electrode 12 and the dielectric material 13 discussed above with reference to FIG. 1. The first portion 20 of switching region 16 is formed over electrode 12, and in the shown embodiment is directly against an upper surface of the electrode 12. The first portion 20 may be formed with ALD, and in some embodiments may be formed to a thickness within a range of from greater than 0 Å to less or equal to about 12 Å.

Referring to FIG. 6, the second portion 22 of the switching region is formed over the first portion 20 utilizing, for example, one or more of ALD, CVD and PCD. The switching region 16 has the total thickness "T", which in some embodiments may be within the range of from about 6 Å to about 20 Å. In some embodiments, the ALD-formed portion 20 may comprise at least about 50% of the total thickness of the switching region 16, by volume; in other embodiments may comprise less than about 50% of the total thickness, by volume; and in some embodiments may comprise about 50% of the total thickness, by volume.

The first and second portions 20 and 22 are separate discrete portions of the switching region 16, and may comprise the compositions discussed above with reference to FIG. 3. Thus, in some embodiments one of the portions 20 and 22 of FIG. 6 comprises a transition metal oxide, and the other does not. For instance, in some embodiments the ALD-formed portion 20 may comprise, consist essentially of, or consist of one or more transition metals in combination with oxygen; and the portion 22 may comprise, consist essentially of, or consist of one or more non-transition elements in combination with oxygen; where at least one of the non-transition elements may be selected from the group consisting of metals, semi-metals, alkaline earth elements, and mixtures thereof. In other embodiments, the ALD-formed portion 20 may comprise, consist essentially of, or consist of the one or more non-transition elements in combination with oxygen; and the second portion 22 may comprise, consist essentially of, or consist of the one or more transition metals in combination with oxygen. In some embodiments, both layers may consist of one or more transition metal oxides (for example, hafnium oxide, tantalum oxide, etc.). In some embodiments, one or both of the layers may comprise one or more metal nitrides (such as aluminum nitride), and in such embodiments the metal nitrides may be insulating metal nitrides.

Referring to FIG. 7, the ion source region 18 is formed over switching region 16, and the top electrode 14 is formed over the ion source region. In the shown embodiment, the ion source region 18 comprises a single homogeneous composition, but in other embodiments it may comprise two or more separate discrete portions (such as, for example, the portions 40 and 42 described above with reference to FIG. 4). In some embodiments, the ion source region 18 comprises at least one of copper, silver and aluminum; and may also comprise tellurium.

As mentioned above with reference to FIG. 1, some embodiments may include ALD-formation of a portion of a switching region to a thickness of less than about one monolayer. FIGS. 8 and 9 illustrate an example of such embodiments.

Referring to FIG. 8, a construction 10*c* comprises the electrode 12 and the dielectric material 13 discussed above with reference to FIG. 1. The first portion 20 of switching region 16 is formed over electrode 12, and in the shown embodiment is directly against an upper surface of the electrode 12. The first portion 20 may be formed with any suitable processing, and in some example embodiments may be formed utilizing one or more of ALD, CVD, PVD and oxidation of a surface of electrode 12.

A second portion of the switching region is formed over the first portion 20 utilizing ALD, and in the shown embodiment the second portion comprises scattered modified regions 50 formed across a surface of portion 20. The modified regions 50 may be formed utilizing transition metal-containing precursor in some embodiments, and accordingly may comprise one or more transition metals. Alternatively, or additionally, the modified regions 50 may be formed utilizing non-transition element-containing precursor, and accordingly may comprise one or more non-transition elements. In some embodiments, such non-transition elements may be selected from the group consisting of metals, semi-metals, alkaline earth elements, and mixtures thereof; and accordingly may, for example, comprise one or both of aluminum and silicon.

The modified regions 50 may be formed by utilizing too few ALD cycles to form a complete monolayer; and in some embodiments may be formed utilizing from one to five ALD cycles.

Referring to FIG. 9, the ion source region 18 is formed over switching region 16, and the top electrode 14 is formed over the ion source region. In the shown embodiment, the ion source region 18 comprises a single homogeneous composition, but in other embodiments it may comprise two or more separate discrete portions (such as, for example, the portions 40 and 42 described above with reference to FIG. 4). In some embodiments, the ion source region 18 comprises at least one of copper, silver and aluminum; and may also comprise tellurium.

Figure 10:
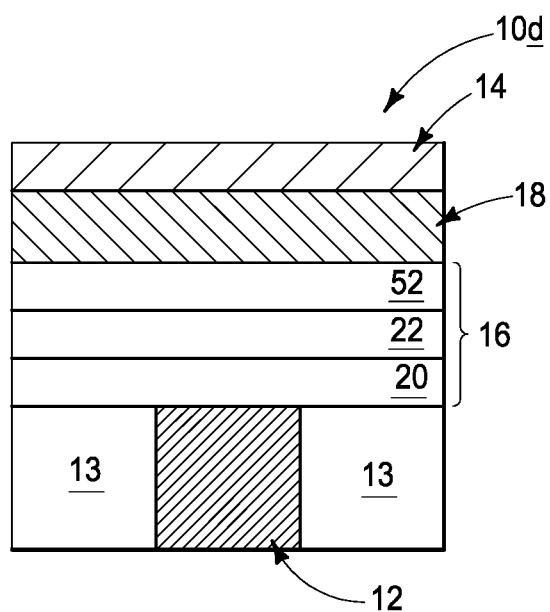
FIG. 10 diagrammatically illustrates another example embodiment memory cell.

The embodiments of FIGS. 1-7 utilize switching regions comprising two discrete portions. In other embodiments, switching regions may comprise more than two discrete portions. For instance, FIG. 10 shows a construction 10d illustrating an example embodiment memory cell having a switching region 16 comprising a third portion 52 over the second portion 22. In some embodiments, all of the portions 20, 22 and 52 may be formed utilizing ALD. In other embodiments, one or more of the portions is formed utilizing processing other than ALD, but at least one of the portions is formed utilizing ALD to enable careful tailoring of the composition and thickness of such portion. The multiple discrete portions of FIGS. 1-10 may remain in a finished construction in some embodiments, and in other embodiments a construction may be heated or otherwise treated to merge at least some of the portions into a combined composition (such as, for example, an alloyed composition). For instance, in some embodiments alternating hafnium oxide layers and silicon oxide layers may be formed as the discrete portions through ALD (or other suitable deposition, such as CVD or PVD), and such layers may be subsequently treated to form hafnium silicate throughout the switching region. The individual layers may have any suitable thicknesses; and in some embodiments may have thicknesses of less than or equal to about 20 Å, less than or equal to about 12 Å, less than or equal to about 10 Å, etc. It may be advantages to utilize ALD for forming thin layers, such as layers having thicknesses of less than or equal to about 20 Å. In another example embodiment, hafnium aluminum oxide may be formed throughout a switching region by merging hafnium oxide layers and aluminum oxide layers. In another example embodiment, a material comprising aluminum, oxygen and silicon (e.g., aluminum silicate) may be formed throughout a switching region by merging aluminum oxide layers and silicon dioxide layers.

The portion 52 may comprise any suitable composition, and in some embodiments may comprise one or more of the compositions discussed above relative to the portions 20 and 22. Further, although the portion 52 are shown as a continuous layer, in other embodiments the portion to may be formed to comprise less than one complete monolayer; and accordingly may be formed analogously to the scattered regions 50 of FIGS. 8 and 9.

Figure 11:
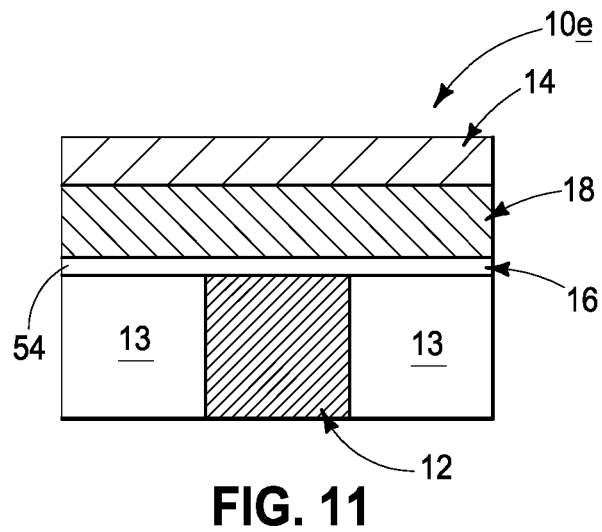
FIG. 11 diagrammatically illustrates another example embodiment memory cell.

In some embodiments, an entirety of a switching region may be formed by ALD as a single composition having a thickness within a range of from greater than 0 Å to less or equal to about 20 Å, or less than or equal to about 12 Å. For instance, FIG. 11 shows a construction 10e illustrating an example embodiment memory cell having a switching region 16 comprising a single ALD-formed composition 54. In some embodiments, such composition may comprise, consist essentially of, or consist of one or more of GeS, GeSe, SiO, ZrO, TiO, TaO, HfO, AlO, WO, SnO, NbO, ZrTiO, ZrWO, AlTiO, VO, MoO, NiO, YO, ReO, MnO, FeO, SiAlO, SiTiO, etc.; where the listed compositions are described in terms of elemental constituents. In some embodiments, such composition may comprise, consist essentially of, or consist of oxygen in combination with one or more of aluminum, hafnium, silicon, titanium and zirconium.

An advantage of utilizing ALD to form the entirety of switching region 16 is that such may enable the composition and thickness of the switching region to be tightly controlled. An advantage of keeping the switching region thin (i.e., within a thickness range of from greater than 0 Å to less or equal to about 20 Å, or less than or equal to about 12 Å) is that such may enable the PMC to be rapidly responsive to changing voltage (i.e., may enable high switchability), which may be desired in some applications.

The various memory cells of FIGS. 1-11 may be representative of a large number of memory cells that may be simultaneously fabricated in order to form an integrated circuit memory array.

The memory cells and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a memory cell. At least a portion of a switching region is atomic layer deposited over a first electrode to a thickness within a range of from greater than 0 angstroms to less than or equal to about 20 angstroms. A second electrode is formed over the switching region.

Some embodiments include a method of forming a memory cell. A first portion of a switching region is formed over a first electrode. A second portion of the switching region is formed over the first portion, with the second portion being formed by atomic layer deposition to a thickness within a range of from greater than 0 angstroms to less than or equal to about 20 angstroms. The second portion is a different composition than the first portion. An ion source region is formed over the switching region. A second electrode is formed over the ion source region.

Some embodiments include a memory cell having a switching region between a pair of electrodes. The switching region is configured to reversibly retain a conductive bridge. The memory cell is in a low resistive state when the conductive bridge is retained within the switching region and is in a high resistive state when the conductive bridge is not within the switching region. The switching region comprises two or more discrete portions, with one of the portions having a thickness within a range of from greater than 0 angstroms to less than or equal to about 20 angstroms and not having a non-oxygen component in common with any composition directly against said one of the portions in the high resistive state of the memory cell.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory cell, comprising:
   forming a first portion of a switching region over a first electrode;
   forming a second portion of the switching region over the first portion, with the second portion being formed by atomic layer deposition to a thickness within a range of from greater than 0 angstroms to less than or equal to about 20 angstroms; the second portion being a different composition than the first portion, one of the first and second portion comprising one or more members of the group consisting of Ti, Zr and Hf, and the other of the first and second portion comprising Mg;
   forming an ion source region over the switching region, the ion source region comprising two discrete portions having different compositions relative to each other, each of the discrete portions comprising one or more of Cu, Si and Al, the ion source region being configured to contribute one or more of aluminum cations, copper cations and silver cations; and
   forming a second electrode over the ion source region.

2. The method of claim 1 wherein the switching region has a total thickness within a range of from about 6 angstroms to about 20 angstroms.

3. The method of claim 1 wherein the second portion is formed with at least one atomic layer deposition cycle and less than or equal to 5 total atomic layer deposition cycles.

4. The method of claim 1 wherein the atomic layer deposition deposits one or more transition metals.

5. The method of claim 1 wherein the atomic layer deposition deposits one or more non-transition elements; wherein said non-transition elements are selected from the group consisting of metals, semi-metals, alkaline earth elements, and mixtures thereof.

6. The method of claim 1 wherein:
   the second portion consists of oxygen in combination with the one or more members of the group consisting of Ti, Hf and Zr; and
   the first portion consists of oxygen in combination with Mg.

7. The method of claim 1 wherein the second portion is at least about 50%, by volume, of a total thickness of the switching region.

8. The method of claim 1 wherein the second portion is less than about 50%, by volume, of a total thickness of the switching region.

9. The method of claim 1 wherein:
   the second portion consists of oxygen in combination with Mg; and
   the first portion consists of oxygen in combination with the one or more members of the group consisting of Zr, Hf and Ti.

10. The method of claim 1 further comprising forming at least one additional portion of the switching region over the second portion.

11. The method of claim 1 wherein the two discrete portions of the ion source region comprise a first portion containing an oxide composition and a second portion containing a nitride composition.

12. The method of claim 1 wherein the first portion of the ion source region contains CuZrAlTeO and the second portion of the ion source region contains AlTeN.

* * * * *